United States Patent [19]

Usugi

[11] 4,276,508

[45] Jun. 30, 1981

[54] ELECTRONIC ATTENUATOR APPARATUS

[75] Inventor: Kikuo Usugi, Toda, Japan

[73] Assignee: Clarion Co., Ltd., Tokyo, Japan

[21] Appl. No.: 31,491

[22] Filed: Apr. 19, 1979

[30] Foreign Application Priority Data

Apr. 24, 1978 [JP] Japan .............................. 53-54439[U]

[51] Int. Cl.³ .............................................. H01P 1/22
[52] U.S. Cl. .................................. 323/354; 179/1 D;
179/1 N; 455/249
[58] Field of Search ..................................... 323/73–74,
323/79–81, 94 R; 333/81 R; 340/347 CC;
455/232, 249; 330/284; 179/1 D, 1 N, 1 VL;
84/1.11, 1.13, 1.26

[56] References Cited

U.S. PATENT DOCUMENTS

| 3,100,851 | 8/1963 | Ross et al. | 363/43 X |
| 3,559,144 | 1/1971 | Isaacs | 323/79 X |
| 3,865,982 | 2/1975 | Feldman et al. | 179/1 N |
| 3,902,398 | 9/1975 | Nakada et al. | 323/80 X |
| 3,977,291 | 8/1976 | Southard | 323/81 X |

Primary Examiner—William M. Shoop
Attorney, Agent, or Firm—Blanchard, Flynn, Thiel, Boutell & Tanis

[57] ABSTRACT

An electronic attenuator includes voltage controlled attenuators, memory circuits and a plurality of switches. The memory circuit stores a level signal selectively provided by setting the switches and supplies it to the voltage controlled attenuator which in response to the level signal attenuates an input signal applied thereto.

15 Claims, 4 Drawing Figures

ELECTRONIC ATTENUATOR APPARATUS

TECHNICAL FIELD AND BACKGROUND OF THE INVENTION

This invention relates to an electronic attenuator apparatus and more particularly to an apparatus for setting a plurality of levels in an audio instrument, for example, a volume level, a tone level and a balance level therein.

An electronic level setting apparatus (an electronic attenuator) used in a conventional audio instrument needs rather a long time to change from a given set level to other desired level. The time is represented as follows:

$$\text{required time} = \frac{\text{(desired level)} - \text{(present level)}}{\text{level change per unit time}}$$

Therefore, the apparatus has a disadvantage in that the larger the difference between the level prior to setting and the level after setting is, the longer the required time will be. Moreover, where it is required to set a plurality of levels, each of the plural level settings requires the respective level setting device and a required time for completing the change of levels increases greatly.

SUMMARY OF THE INVENTION

Therefore, an object of this invention is to provide an electronic attenuator apparatus capable of instantaneously changing a plurality of setting levels to desired ones in an audio instrument and the like.

Further, another object of this invention is to attain simplification of an electronic attenuator apparatus by reducing the number of required level setting devices to one.

In order to attain the above objects, according to this invention, the attenuation factor of a voltage controlled attenuator is controlled by the level of a voltage supplied from a memory circuit selectively set. Moreover, in this invention, a plurality of switches may be used, as level setting means, to provide a level signal.

DETAILED DESCRIPTION OF PREFERRED EMBODIMENTS

Figure 1:
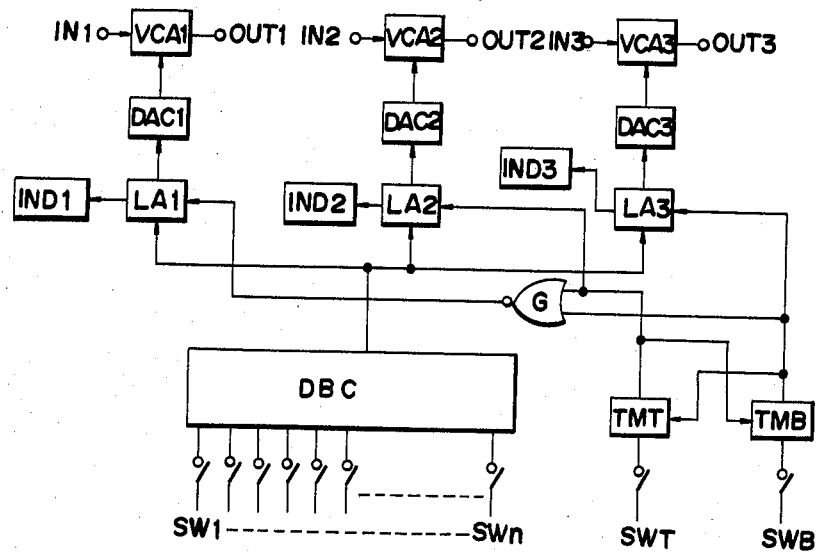
FIG. 1 is a block diagram of a preferred form of an electronic attenuator according to this invention.

In FIG. 1, a voltage controlled attenuator VCA ($VCA_1$-$VCA_3$) operates to determine an attenuation factor between an input IN ($IN_1$-$IN_3$) and an output OUT ($OUT_1$-$OUT_3$) in response to the level of an analog signal (voltage) from a D-A converter DAC ($DAC_1$-$DAC_3$). The D-A converter DAC converts a digital signal temporarily stored in a memory circuit (latch circuit) LA ($LA_1$-$LA_3$) into the analog signal. A decimal to binary converter circuit DBC converts a decimal level signal set by switches $SW_1$-$SW_n$, connected in parallel thereto, to a binary level signal and provides it to the memory circuit LA. The switches are weighted in accordance with the decimal system.

A memory circuit $LA_1$ stores the binary level signal from the decimal-binary converter circuit DBC when the output signal of a NOR gate G is high. A memory circuit $LA_2$ stores the binary level signal when the output signal of a tone timer TMT is high and a memory circuit $LA_3$ stores it when the output signal of a balance timer TMB is high. The tone timer TMT and the balance timer TMB are triggered by make signals of manual switches SWT and SWB, respectively, and then provide output signals to the memory circuits $LA_2$ and $LA_3$ and to the NOR gate G for a given time irrespective of the make times of said switches. Further, the timer TMT provides its output signal to the timer TMB and vice versa so that an output signal of one of them may be inhibited from being supplied to the memory circuit while the other operates, and switches of non-lock type may be preferred as the switches $SW_1$-$SW_n$, SWT and SWB.

Now, an audio signal is applied to the input $IN_1$ of the voltage controlled attenuator $VCA_1$ and is attenuated in accordance with an attenuation factor set therefor to provide an attenuated audio signal at an output $OUT_1$ thereof. Its volume level is indicated by a digital indicator $IND_1$ based on the binary level signal stored in the memory circuit $LA_1$. Illuminated-type switches (not shown) may alternatively be coupled with the switches $SW_1$-$SW_n$ instead of the digital indicator.

When any one of the switches $SW_1$-$SW_n$ is selected and depressed to obtain a desired volume level, the decimal-binary converter circuit DBC converts a decimal level signal set by the selected switch to a binary level signal and provide it to the input of the memory circuits. At that time, the output signals of the tone timer TMT and the balance timer TMB are at low levels and, therefore, the output signal of the NOR gate G is at a high level, so that only the memory circuit $LA_1$ stores the binary level signal. This signal stored in the memory circuit $LA_1$ is converted to an analog signal (voltage) by the D-A converter $DAC_1$. The voltage controlled attenuator $VCA_1$ attenuates an audio signal applied to the input $IN_1$ thereof in accordance with the output of the D-A converter $DAC_1$ to provide an attenuated audio signal to the output $OUT_1$ thereof. The aforesaid attenuating level change of volume in the voltage controlled attenuator $VCA_1$ can be done instantaneously.

Where it is intended to set a desired tone level, the tone switch SWT is depressed. In this case, the switches $SW_1$-$SW_n$ are representative of the respective tone levels. The tone timer TMT holds the output signal thereof at a high level during a time which is usually required from depression of the tone switch SWT to depression of any one of the switches $SW_1$-$SW_n$, and inhibits the output signal of the balance timer TMB from being produced. Said time is freely adjustable. The decimal level signal provided by the switches $SW_1$-$SW_n$ is stored only in the memory circuit $LA_2$ while the output signal of the tone timer TMT is high. A tone setting signal applied to the input $IN_2$ of the voltage controlled attenuator $VCA_2$ may be controlled in a similar manner to that in the volume level setting as previously described. When the tone timer TMT output changes to low after the preset time has passed, the output of the converter DBC returns to such condition that it may be stored in the memory. Balance level setting may be done in a similar manner to the tone level setting.

Figure 2:
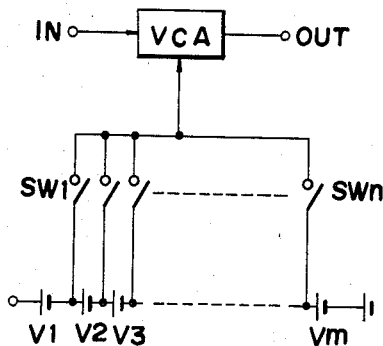
FIG. 2 is a block diagram of one level setting portion of another form of an electronic attenuator according to this invention.

FIG. 2 is a circuit diagram of another embodiment of this invention, showing only one level setting portion thereof. In this embodiment, by selection of one of the switches $SW_1$-$SW_n$, a voltage is selected from voltage sources $V_1$-$V_m$ and is supplied to a voltage controlled attenuator VCA.

Figure 3:
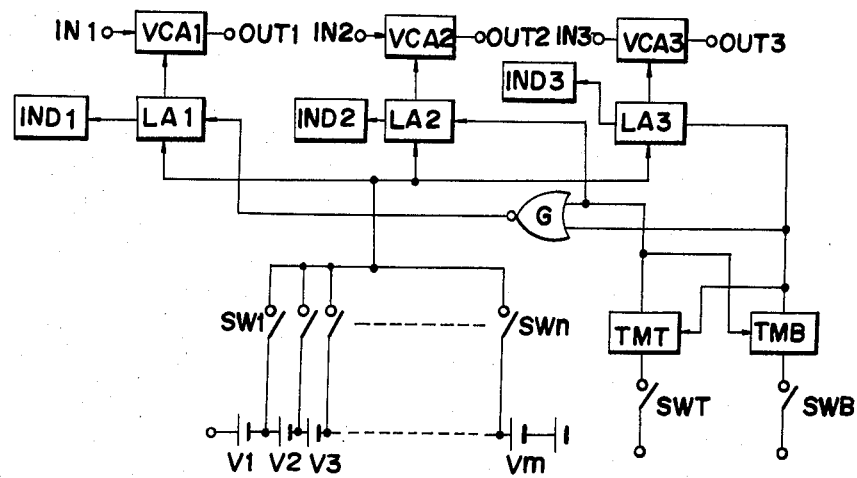
FIG. 3 is a block diagram of still another form of an electronic attenuator according to this invention.

FIG. 3 shows still another embodiment of this invention. In the circuit as illustrated in the figure, in order to selectively set a plurality of levels, for example three levels, memory circuits (latch circuits) $LA_1$-$LA_3$ and a selector circuit comprising a NOR gate G and two timers TMT and TMB analogous to like elements shown in FIG. 1, are disposed between a level setting circuit comprising switches $SW_1$-$SW_n$ and voltage sources $V_1$-$V_m$, and voltage controlled attenuators $VCA_1$-$VCA_3$.

Figure 4:
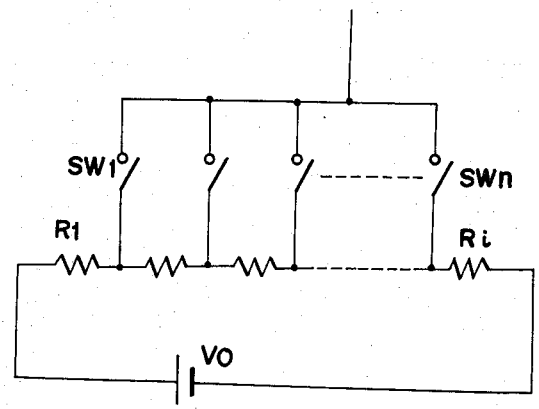
FIG. 4 is a circuit diagram showing a modification of voltage sources illustrated in FIGS. 2 and 3.

The operation of the above embodiment will be easily understood by referring to the operation of the foregoing embodiments illustrated in FIGS. 1 and 2. Further, as shown in FIG. 4 the voltage sources may be replaced with a plurality of resistors $R_1$-$R_i$ connected in series across one voltage source $V_o$.

As described above, according to this invention, a defect involved in a conventional electronic attenuator, in that it takes a considerable time to obtain a desired level setting condition, can be eliminated. Furthermore, even when plural level setting is required, the attenuating apparatus of this invention needs not more than one level setting circuit and a selector circuit, simplifying the construction of the apparatus. In addition, the time required for level setting is much reduced.

I claim:

1. An electronic attenuator apparatus comprising:
    a plurality of voltage controlled attenuator circuits each varying an attenuation factor between an input and an output in response to the level of a voltage supplied thereto;
    a plurality of hold circuits each connected to a corresponding said attenuator circuit for holding said voltage and for supplying it to said attenuator circuit to control said attenuation factor;
    a level setting circuit for manually setting a level signal indicating said level of the voltage; and
    control means for selectively supplying said level signal from said level setting circuit to one of said hold circuits.

2. An apparatus according to claim 1 wherein each of said hold circuits includes a memory circuit for storing said level signal.

3. An apparatus according to claim 2 wherein said level setting circuit includes a plurality of switches connected in parallel with each other to provide said level signal.

4. An apparatus according to claim 3 wherein said control means includes a NOR gate for operating one of said memory circuits to store said level signal therein.

5. An apparatus according to claim 3 wherein said level setting circuit includes a plurality of voltage sources each being connected in parallel with the switches, respectively, which are connected so as to combine outputs thereof.

6. An apparatus according to claim 2 which further comprises indicator means for indicating said level signal in said memory circuits.

7. An apparatus according to claim 3 wherein said level setting circuit includes a plurality of resistors connected in series with a voltage source, said resistors being connected in parallel with the switches, respectively, which are connected so as to combine outputs thereof.

8. An electronic attenuator apparatus comprising:
    a voltage controlled attenuator circuit having an input terminal and an output terminal and responsive to a control voltage signal for varying the attenuation factor applied to electronic signals passing through said attenuator circuit from said input to output terminals;
    level setting means for manually selecting a desired level of said control voltage signal;
    a hold circuit for storing said selected level of the control voltage signal and for supplying to said attenuator circuit said control voltage signal corresponding to said selected level stored in said hold circuit; and
    control means having manually operated input means and responsive thereto for effecting said storage into said hold circuit of said selected level of the control voltage signal.

9. The apparatus defined in claim 8, including a plurality of said voltage controlled attenuator circuits and a plurality of said hold circuits, each attenuator circuit having one of said hold circuits associated therewith, and said control means are further responsive to said input means for selectively storing in any said hold circuit a said selected level from said level setting means.

10. The apparatus defined in claim 9, wherein said hold circuits each comprise a semiconductor memory circuit.

11. The apparatus defined in claim 10, wherein said selected level from the level setting means is a digital binary-coded-decimal signal, said control voltage signal is an analog signal, said memory circuits are digital latch circuits, and said hold circuits each comprise digital-to-analog converter circuits for converting said digital selected level stored in the hold circuit into said analog control voltage signal for the associated attenuator circuit.

12. The apparatus defined in claim 11, wherein said level setting means comprise a plurality of switches and a decimal-to-binary converter responsive to said switches for producing said binary-coded-decimal selected level signal.

13. The apparatus defined in claim 9, wherein said level setting means comprise a plurality of voltage sources connected in series and a plurality of switches, each of said switches having one end connected to a respective junction between said connected sources, and the other ends of said switches being connected in common and to each of said hold circuits.

14. The apparatus defined in claim 9, wherein said level setting means comprise a plurality of resistors connected in series across a voltage source and a plurality of switches, each of said switches having one end connected to a respective junction between said connected resistors, and the other ends of said switches being connected in common and to each of said hold circuits.

15. The apparatus defined in claim 9, including indicator means responsive to the selected level in each said hold circuit for effecting a visual display of each such level.

* * * * *